(12) United States Patent
Green

(10) Patent No.: US 7,496,881 B2
(45) Date of Patent: Feb. 24, 2009

(54) MASK VALIDATION USING CONTOURS

(75) Inventor: Seth Green, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 11/478,424

(22) Filed: Jun. 29, 2006

(65) Prior Publication Data

US 2008/0005718 A1    Jan. 3, 2008

(51) Int. Cl.
   *G06F 17/50* (2006.01)
(52) U.S. Cl. .................. 716/19; 430/5; 430/30
(58) Field of Classification Search ............. 716/19–21; 430/5, 30; 438/14–18
   See application file for complete search history.

(56) References Cited

U.S. PATENT DOCUMENTS

| | | | | |
|---|---|---|---|---|
| 5,553,273 A | * | 9/1996 | Liebmann | 716/21 |
| 5,900,340 A | * | 5/1999 | Reich et al. | 430/22 |
| 6,704,695 B1 | * | 3/2004 | Bula et al. | 703/6 |
| 2005/0268256 A1 | * | 12/2005 | Tsai et al. | 716/4 |

OTHER PUBLICATIONS

Kubota, H., et al., "A Fast Method of Simulating Resist Pattern Contours Based on Mean Inhibitor Concentration", Jpn. J. Appl. Phys., vol. 37, pp. 5815-5820 (1998).*

* cited by examiner

*Primary Examiner*—Paul Dinh
*Assistant Examiner*—Nha T Nguyen
(74) *Attorney, Agent, or Firm*—Lee & Hayes, PLLC

(57) ABSTRACT

Embodiments of mask validation using simulated resist contours are presented herein. The mask validation system disclosed utilizes simulated resist contour of a mask useable for semiconductor device manufacture to validate printed resist geometries. The mask validation system further allows for the sampling of photolithographic simulations of the mask to obtain sampling points to form the simulated contours.

18 Claims, 8 Drawing Sheets

MASK VALIDATION USING CONTOURS

BACKGROUND

Masks are used in the manufacture of semiconductors (e.g., computer chips) to produce features on a wafer. For example, masks may be used to etch features from resist that, when implemented, perform a variety of operations, such as logic operations using switches, gates, and so on. However, the functionality desired from semiconductors is ever increasing and therefore features are continually added to semiconductors to provide this functionality. Further, the size of these features is also ever decreasing to permit these additional features to be added to the semiconductors, to increase the speed at which the operations may be performed, and so on. Therefore, a mask may result in an intricate layout of relatively small and numerous features.

Validation techniques were developed to ensure that these features would be produced and therefore operate as desired, such as in a desired shape, size, spacing and so on. One such traditional technique sampled contours generated by a lithographic simulation of the mask at discrete locations on the desired layout. Measurements were then performed at these points in a limited number of directions to determine whether these sampled points complied with the desired structure, i.e., would form desired features of a semiconductor device. However, this validation was spatially discrete in that validation was typically performed using just these sampled points. Further, this validation technique was also constrained by the limited number of directions that were tested. Therefore, the use of discrete points and limited directions could miss violations of desired parameters during the validation process. Although the number of points sampled and/or the number of directions could be increased to increase accuracy, such an increase typically involved a significant increase in an amount of computing resources used to perform the validation. Therefore, this traditional technique typically involved a tradeoff between accuracy desired and the amount of resources that were available.

BRIEF DESCRIPTION OF THE DRAWINGS

The same reference numbers are utilized in instances in the discussion to reference like structures and components.

DETAILED DESCRIPTION

In the following discussion, exemplary devices are described which may provide and/or utilize techniques to validate masks by analyzing the resist contours to be produced by the mask. Exemplary procedures are then described which may be employed by the exemplary devices, as well as by other devices without departing from the spirit and scope thereof.

Exemplary Devices

Figure 1:
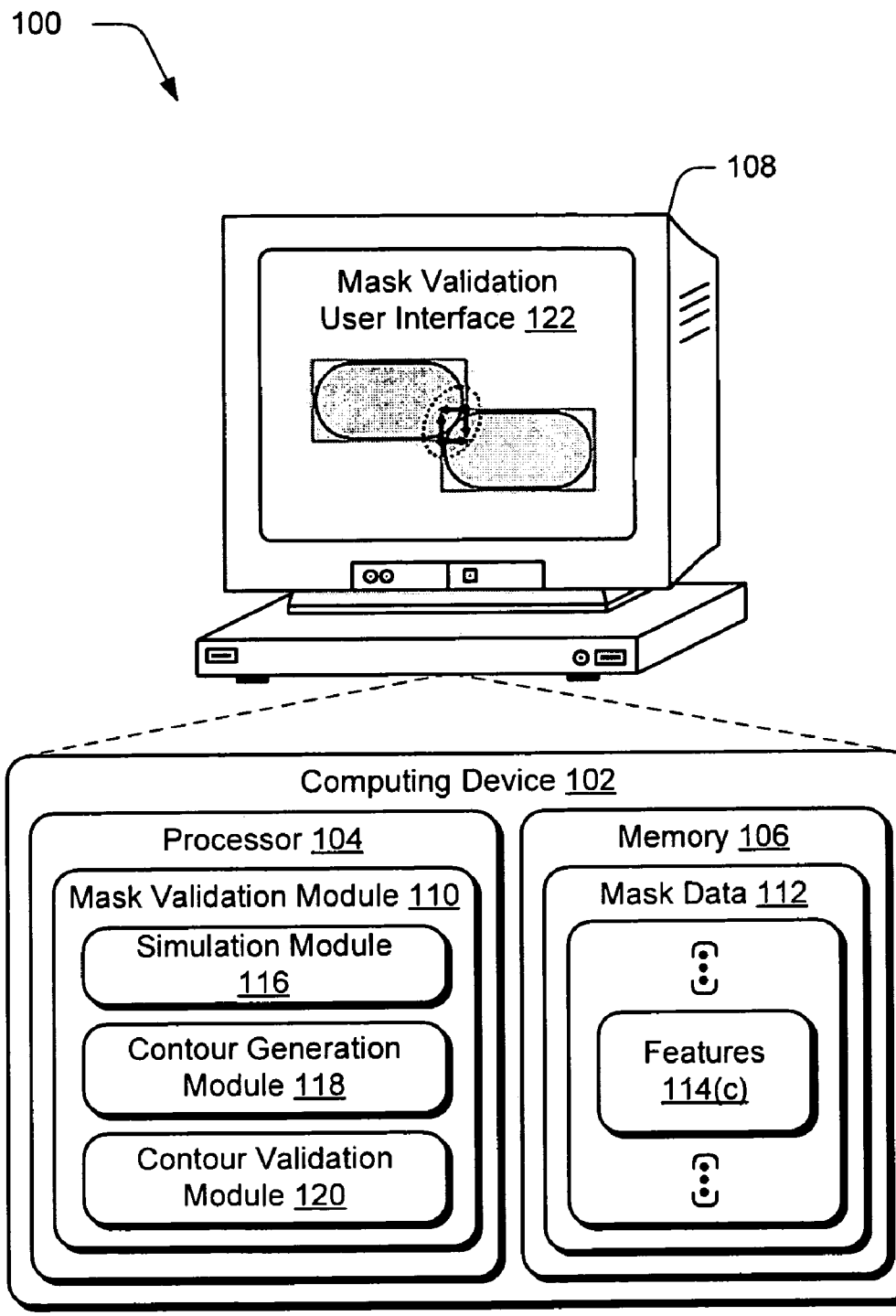
FIG. 1 is an illustration of an exemplary implementation of a computing device that is operable to validate a mask using contours.

FIG. 1 illustrates an exemplary implementation 100 of a computing device 102 that is operable to employ techniques to validate masks using contours. The computing device 102 may be configured in a variety of ways, such as a traditional desktop computer (e.g., a desktop PC), a server, a notebook computer, a personal information appliance, and so on. Thus, the computing device 102 may be configured as a "thick" computing device having significant processing and memory resources (e.g., a server) to a "thin" computing device having relatively limited processing and/or memory resources, such as a personal information appliance. A wide variety of other configurations are also contemplated.

The computing device 102, as illustrated in FIG. 1, includes a processor 104, memory 106, and an output device, which is illustrated as a display device 108 in FIG. 1 but may assume a wide variety of other configurations, such as a network interface. The display device 108 is communicatively coupled to the processor 104 via a bus, such as a host bus of a graphics memory controller hub. The processor 104 may be configured in a variety of ways, and thus, is not limited by the materials from which it may be formed or the processing mechanisms employed therein. For example, the processor may be comprised of semiconductor(s) and/or transistors (e.g., electronic integrated circuits (ICs)), and so on. Additionally, although a single processor 104 is illustrated, the processor 104 may be representative of multiple processors (which may be on the same or different semiconductor devices) that are communicatively coupled to the memory 106 through use of a bus.

The memory 106 may be representative of "main memory" of the computing device 102, persistent storage (e.g., a hard disk drive), removable computer-readable media (e.g.; a digital video disc (DVD)), and other types of computer-readable media. Likewise, although a single memory 106 is illustrated, the memory 106 may be representative of multiple memory devices, such as dynamic random access memory (DRAM), read-only memory (ROM), and a hard disk drive. A variety of other implementations are also contemplated.

The computing device 102 is illustrated as executing a mask validation module 110 on the processor 104, which is also storable in memory 106. The mask validation module 110 is representative of functionality that is executable to validate a mask usable to manufacture a semiconductor device, e.g., a computer "chip". For example, the mask validation module 110 may employ a contour-based optical proximity correction (OPC) validation methodology that uses geometric operations to validate the "quality" of a mask, such as to ensure that semiconductor devices produced from the mask have robustly-defined features that meet desired parameters.

For example, a semiconductor device is typically formed via the photolithography in which physical mask is used to produce a pattern of features in photosensitive resist covering a wafer. Thus, the geometry of the mask affects the intensity and phase of the light which passes through it, causing an image to appear on the surface of the wafer. The boundary between the exposed and unexposed regions of the wafer represents resist contours. Due to the wave nature of light and the relatively small feature scale of the mask, the wafer image, in general, may not have the same exact geometry as a mask.

The mask validation module 110, for instance, may receive mask data 112 describing a plurality of features 114(c), where "c" can be any integer from one to "C". For example, the mask data 112 may be received by obtaining a description of the mask geometry in electronic format. The mask data 112 may then be processed by the mask validation module 110 to determine whether the mask represented by the mask data 112 (and more particularly features 114(c) of the resist image to be formed using the mask) will function as desired by producing a semiconductor that complies a desired size, spacing, and other desired geometries.

A variety of functionality may be employed by the mask validation module 110 to validate the mask, which is illustrated as a simulation module 116, a contour generation module 118 and a contour validation module 120. The simulation module 116 is representative of functionality that may be employed to simulate the mask. The contour generation module 118 is representative of functionality to produce contours via a lithographic simulation of the mask and the contour validation module 120 is representative of functionality to validate the contours using geometric operations. Results of the validation may then be output in a mask validation user interface 122 via an output device, such as the display device 108. Although these modules are illustrated separately, it should be apparent that the functionality represented by these modules may be further divided or combined as desired.

The mask validation module 110, for instance, may use simulated resist contours generated from the mask data 112 via a lithographic model. These simulated contours may then be measured to ensure adequate representation of desired wafer geometries. For example, these contours may be checked to ensure minimum thickness (referred to as a "pinch" check), minimum spacing between features (referred to as a "bridge" check), fidelity to mask design data (e.g., positive and/or negative deviation), case-specific tests (e.g., a coverage check), and so on. Further discussion of these different validation checks may be found in relation to FIGS. 3-8.

Use of contours and geometric operations provides for greater accuracy over traditional validation techniques. For example, as previously described, traditional techniques validated a mask by sampling the mask at discrete locations. The sampling density was typically specified by a user as a fixed quantity, and therefore was not adjusted for areas of high-geometric complexity. At each of these sampled points, horizontal and/or vertical search lines were created and the distance to a contour was measured. This distance, which was the displacement between the desired and simulated contours, was then used to determine if a violation occurred. However, due to the discrete nature of this technique, inaccuracies and other errors may be encountered.

Figure 2:
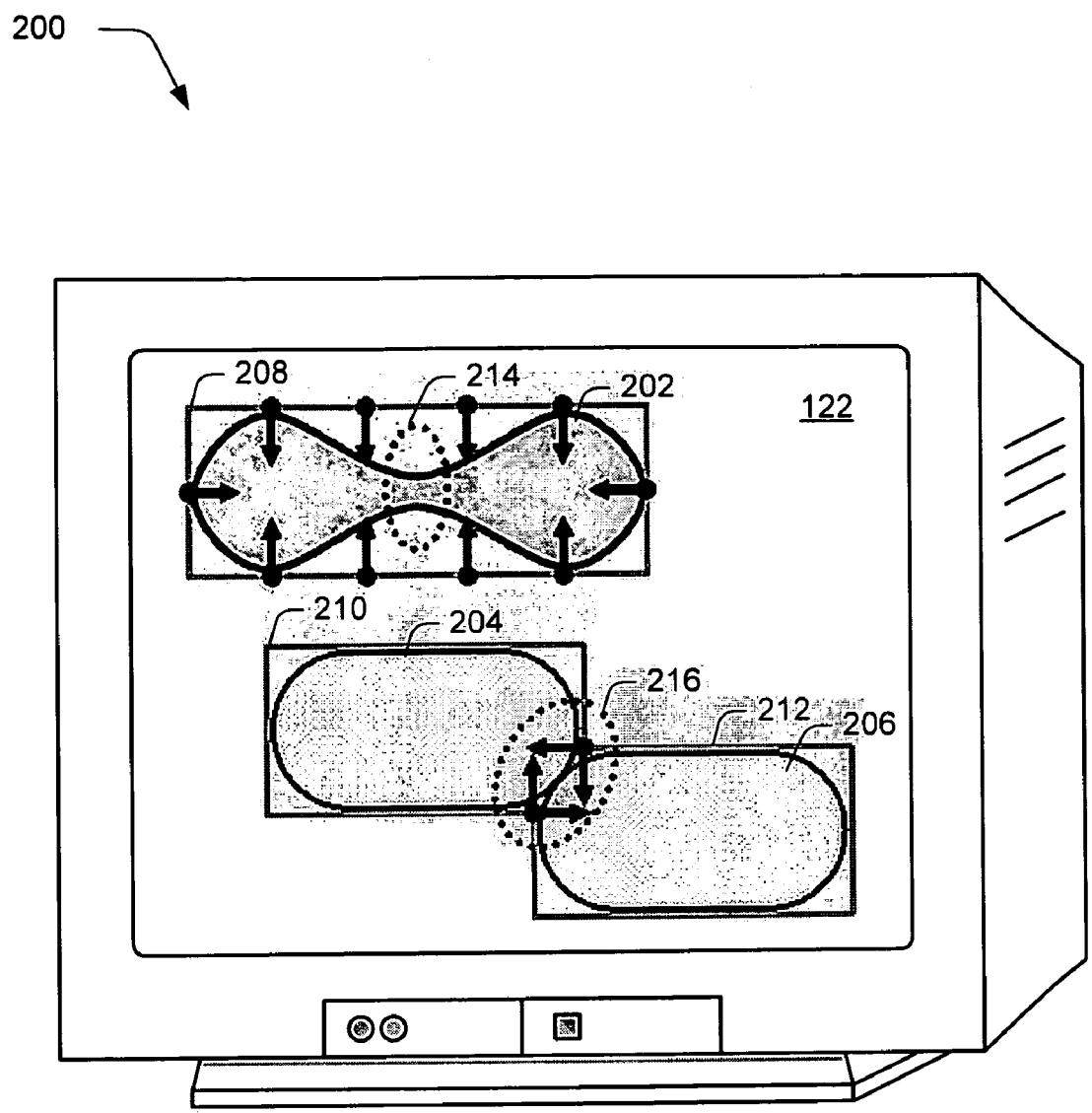
FIG. 2 is an illustration of an exemplary implementation of a mask validation user interface of FIG. 1 as outputting features which are to be created using a mask and validated to determine whether these features meet desired parameters.

FIG. 2, for example, illustrates an exemplary implementation 200 of the mask validation user interface 122 of FIG. 1 as outputting features which are to be created using a mask and validated to determine whether these features meet desired parameters. The user interface 122 includes three features to be validated, a first feature 202, a second feature 204 and a third feature 206 that are to be components of a semiconductor device manufactured using a physical mask. The respective desired geometries are depicted by boxes 208, 210, 212 around the respective features 202, 204, 206.

As previously described, inaccuracies may be encountered using previous sampling techniques, which are illustrated by the arrows in the user interface 122. For example, a pinch violation 214 is shown in the first feature 202 that may go undetected using sampling and a limited number of directions because the violation occurs between sampling points. Another pinch violation 216 is also shown that may be missed by discrete point sampling techniques due to horizontal and vertical orientations of the contour distance measurements which are inadequate to find angled violations. As previously described, although denser samples using additional angles may be used to increase accuracy, this generally results in a significantly greater resource cost.

The mask validation module 110 may be executable to employ contour-based validation methods that may improve accuracy without a significant increase in resource cost. The mask validation module 110, for instance, may perform checks for violations using the contours which are spatially continuous, and therefore increases the likelihood that violations occurring at locations along the contours and angles from those contours are detected. Furthermore, once detected, violations may be clearly defined by geometric features representing the region of violation. As shown in the user interface 122 of FIG. 2, for instance, the pinch violations 214, 216 are detectable by performing a set of geometric operations on the resist contour forming the respective features 202, 204, 206. Further discussion of detection of violations may be found in relation to FIGS. 3-8.

Although the previous discussion described the use of contours in the validation of a mask, it should be apparent that these techniques may be combined with a variety of other techniques. For example, as shown in the user interface 122 of FIG. 2, discrete point validation techniques may be combined with contour techniques to validate a mask. A variety of other examples are also contemplated.

Generally, any of the functions described herein can be implemented using software, firmware, hardware (e.g., fixed logic circuitry), manual processing, or a combination of these implementations. The terms "module," "functionality," and "logic" as used herein generally represent software, firmware, hardware, or a combination thereof. In the case of a software implementation, the module, functionality, or logic represents program code that performs specified tasks when executed on a processor (e.g., CPU or CPUs such as the processor 104 of FIG. 1). The program code can be stored in one or more computer readable memory devices, e.g., memory 106 of FIG. 1. The features of the techniques to validate masks using contours described below are platform-independent, meaning that the techniques may be implemented on a variety of commercial computing platforms having a variety of processors.

Exemplary Procedures

The following discussion describes mask validation techniques that may be implemented utilizing the previously described systems and devices. Aspects of each of the procedures may be implemented in hardware, firmware, software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1.

Figure 3:
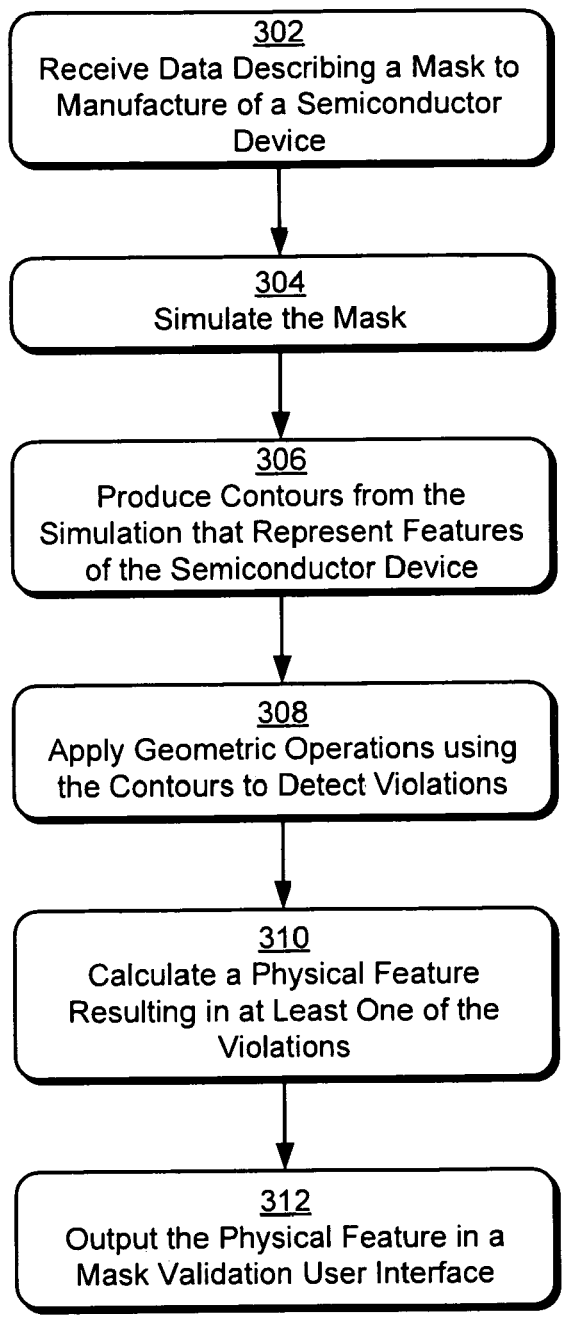
FIG. 3 is a flow diagram depicting a procedure in an exemplary implementation in which a physical mask is validated using contours simulated from the physical mask.

FIG. 3 depicts a procedure 300 in an exemplary implementation in which a physical mask is validated through use of contours simulated lithographically from a physical mask and geometric operations involving the mask. Data is received describing a mask that is to be used to manufacture a semiconductor device (block 302), such as an integrated circuit configured to operate as the processor 104 of FIG. 1. The data may be received in a variety of ways. For example, the mask data 112 may result from optical scanning of a physical mask, computer data to be used to manufacture a physical mask, scanning of an integrated circuit made through use of a mask, and so on.

The mask is then simulated (block 304) using the received data. The simulation module 116, for instance, may be executable to convert the mask data 112 into a virtual simulation of the physical mask, such as by processing the mask data 112 into a form that is acceptable by the contour generation module 118. Contours are then produced from the simulation that represent features of the semiconductor device (block 306). For example, the simulation and the production of contours may be performed in a single step through optical scanning, modeling, and so on of the mask. In another instance, the simulation may be performed by sampling of the resist contour produced by the mask at discrete points and then forming continuous contours from the discrete points, further discussion of which may be found below.

Geometric operations are then applied using the contours to detect violations of one or more of the features (block 308). The mask validation module 110, for instance, may use a geometric Boolean engine, use computation of "closest pairs" which may be accelerated by a computation of a geometric medial axis or a geometric query data structure, and so on. A variety of different violations may be detected using these techniques.

Figure 4:
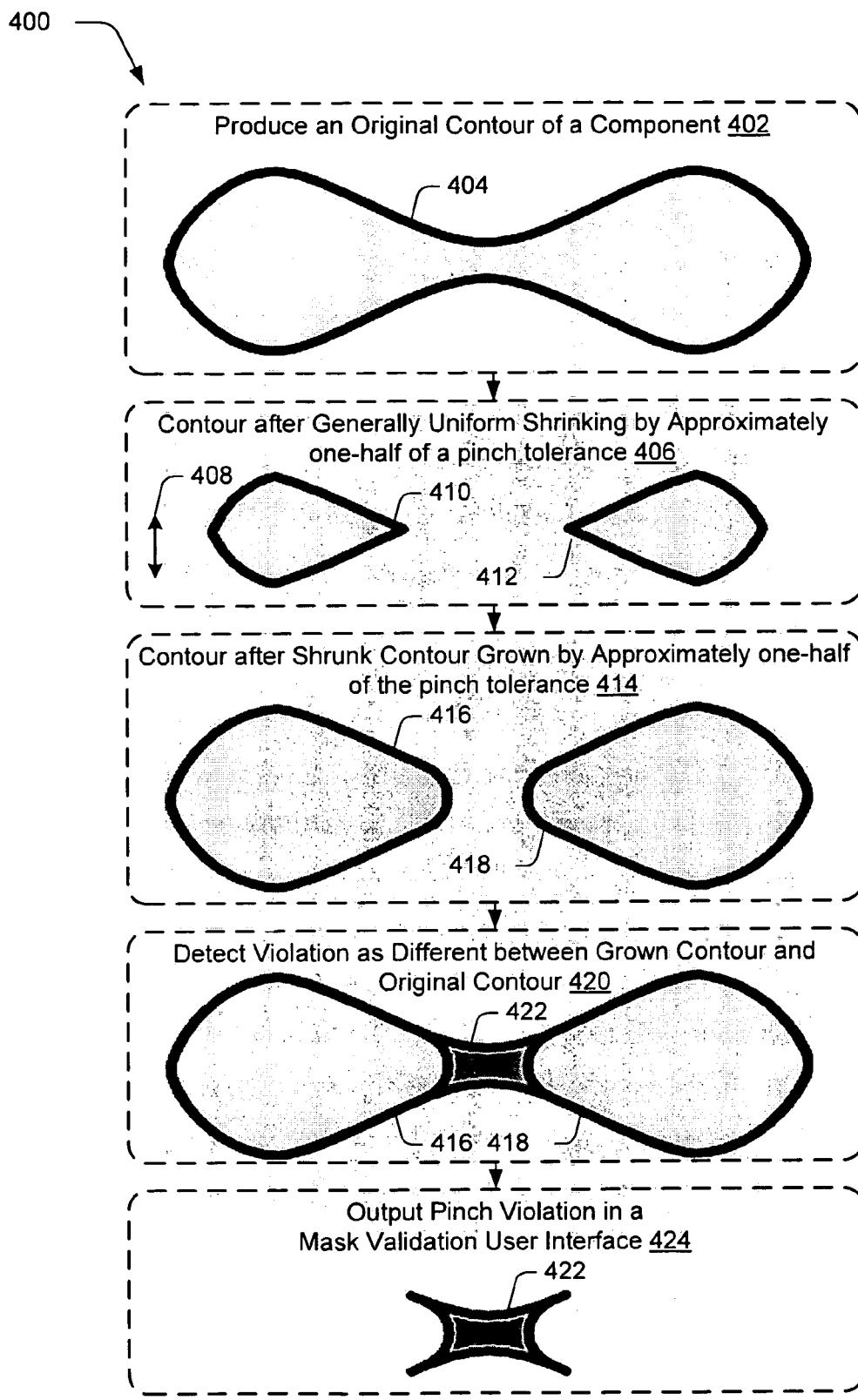
FIG. 4 is a flow diagram depicting a procedure in an exemplary implementation showing detection of a pinch violation using a geometric operation.

For example, pinch, bridge, deviation and coverage violations may be detected, further discussion of which may be found in relation to FIGS. 4-7. In another example, filtering operations may be used during validation to ignore "acceptable" violations, further discussion of which may be found in relation to FIG. 8. In each of these examples, each violation type has a simple geometric definition. For instance, the pinch violation of FIG. 4 is detectable using a geometric shrink, followed by a geometric grow, followed by a geometric difference.

After the geometric operations are applied, physical features may be calculated that result in at least one of the violations (block 310). For example, portions of one or more of the features that do not meet the parameters specified by the geometric operations may be located. The physical feature that is calculated may then be output in the user interface (block 312), thus readily identifying to a user the cause of the error, as opposed to previous technique in which a numerical value was output regarding a discrete sampled point, which did not readily inform the user as to why that point or its respective feature resulted in the output of the value. Further illustration of detection of violations and output of physical features that resulted in the violations may be found in relation to the following figures.

As previously described, it should be noted that the contour itself may be generated through a sampling technique and then used to generate the contours, such as through interpolation and use of "smoothing" techniques to connect sampled points, and so on. Even in such an instance, the contour-based validation methodology is not limited in terms of inter-contour violation detection as discussed in relation to the user interface 122 of FIG. 2, but rather in terms of minimum violation feature size identifiable by the sampling resolution used.

FIG. 4 depicts a procedure 400 in an exemplary implementation showing detection of a pinch violation using a geometric operation. An original contour of a component is produced (block 402). For example, the original contour 404 may be produced by lithographic simulation, optical scanning, connection of sampled points from a physical mask, and so on. The original contour 404, for instance, may represent a spatially continuous feature of a component of a semiconductor device that is to be produced using the mask.

The original contour 404 is then shrunk by approximately one-half of a pinch tolerance (block 406). The pinch tolerance 408, for instance, may be defined as a minimal dimension of resist to be formed using the mask. As shown in block 406, the shrunk contour results in two sub-components 410, 412 in this instance since portions of the original contour that were less than approximately one-half of the pinch tolerance 408 were removed.

The shrunk contour (in this instance the two-sub components 410, 412) is then grown by approximately one-half of the pinch tolerance (block 414). As shown in block 414, the grown contour in this instance also results in two sub-components 416, 418.

A violation is then detected as a difference between the grown contour and the original contour (block 420). In block 420, for instance, the difference between the two grown sub-components 416, 418 and the original contour 404 of block 402 is shown as an area 422 between the two grown-subcomponents 416, 418. This area 422 corresponds to a portion of the original contour 404 that is approximately less than the pinch tolerance 408, and therefore results in a pinch violation.

The pinch violation may then be output in a mask validation user interface (block 424). For example, the pinch violation 422 may be output singly as a geometric representation of portions of the mask that resulted in the violation. In another example, the pinch violation 422 may be output as superimposed over the simulated mask, an example of which is shown in block 420. A variety of other examples are also contemplated. Thus, the geometric operation to detect a pinch violation may be defined as symmetric difference between a resist contour to be formed using a mask and a set including the resist contour that is shrunk and then grown by approximately one-half of a pinch tolerance.

Figure 5:
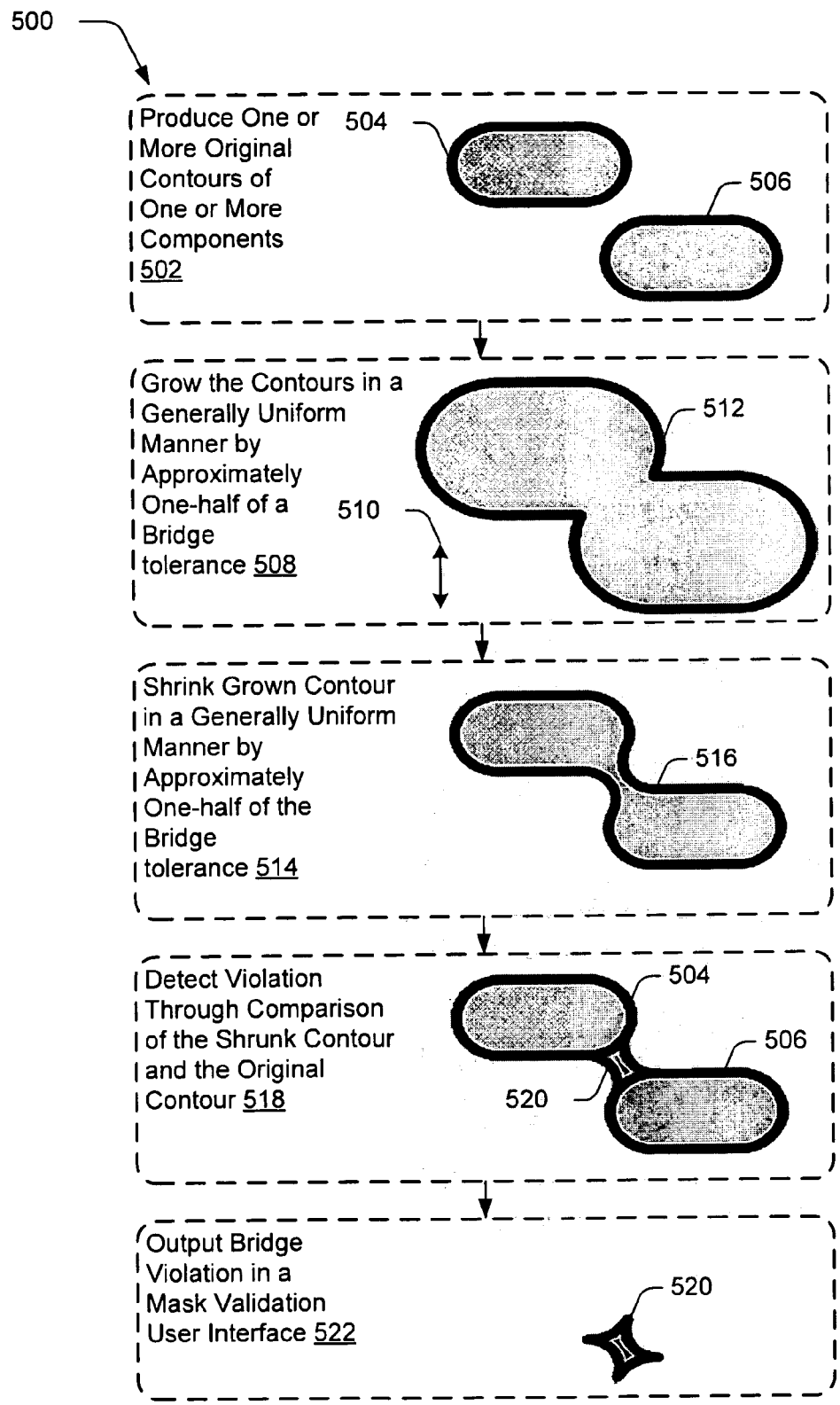
FIG. 5 is a flow diagram depicting a procedure in an exemplary implementation showing detection of a bridge violation using a geometric operation.

FIG. 5 depicts a procedure 500 in an exemplary implementation showing detection of a bridge violation using a geometric operation. One or more original contours of one or more components are produced (block 502). In the illustrated instance of block 502, two original contours 504, 506 are illustrated which correspond to two respective features of a mask.

The contours are grown in a generally uniform manner by approximately one-half of a bridge tolerance (block 508). For example, the bridge tolerance 510 may represent an approximation of a minimal desired distance between features of a semiconductor device. In the illustrated instance of block 508, a single continuous contour 512 is produced by growing the original contours 504, 506 of block 502.

The grown contour is then shrunk in a generally uniform manner by approximately one-half of the bridge tolerance (block 514). The shrunk contour 516 in the illustrated instance of block 514 remains a single continuous contour.

A violation is then detected through comparison of the shrunk contour 516 and the one or more original contours 504, 506 (block 518). The violation 520 is illustrated as block 518 as the difference resulting from the comparison, which may then be output in a mask validation user interface (block 522). As before, the output may be performed in a variety of ways, such as superimposed over the original contours simulated from the physical mask. Thus, the geometric operation for a bridge violation may be detected as a symmetric difference between a resist contour to be formed using a mask and a set defined as the resist contour that is grown and then shrunk by approximately one-half of a bridge tolerance.

Figure 6:
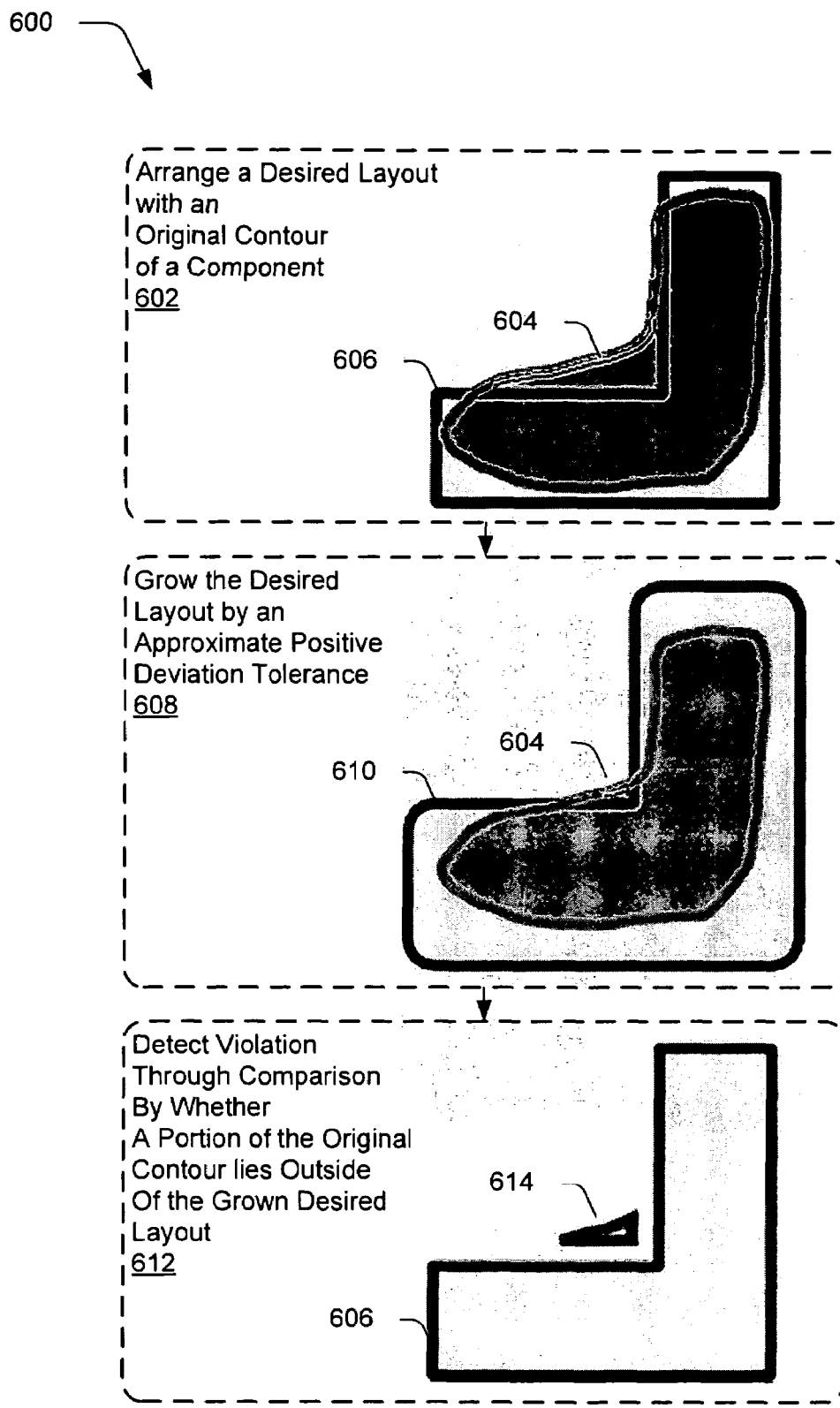
FIG. 6 is a flow diagram depicting a procedure in an exemplary implementation showing detection of a positive deviation violation using a geometric operation.

FIG. 6 depicts a procedure 600 in an exemplary implementation showing detection of a positive deviation violation using a geometric operation. A desired layout of a feature is arranged with an original contour of a feature produced from a mask (block 602), examples of which are depicted in block 602 by a contour 604, produced from a mask, and a desired layout 606.

The desired layout is grown by an approximation of a positive deviation tolerance (block 608). Thus, in this instance it should be noted that the desired layout and not the original contour is grown as shown by the grown desired layout 610 of block 608.

A violation is detected by determining whether a portion of the original contour lies beyond the grown desired layout (block 612). As illustrated in block 612, for instance, a portion 614 of the original contour 604 lies outside the grown desired layout 610. This portion 614 thereby violates the approximation of the positive deviation tolerance and may be depicted within a user interface. Thus, a positive deviation tolerance may be defined as a Boolean difference between a contour produced from a mask and a set defined by a desired layout grown by an approximation of the positive deviation tolerance. Conversely, a negative deviation tolerance may be defined as a Boolean difference between an original contour and a desired layout shrunk by an approximation of a negative deviation tolerance.

Figure 7:
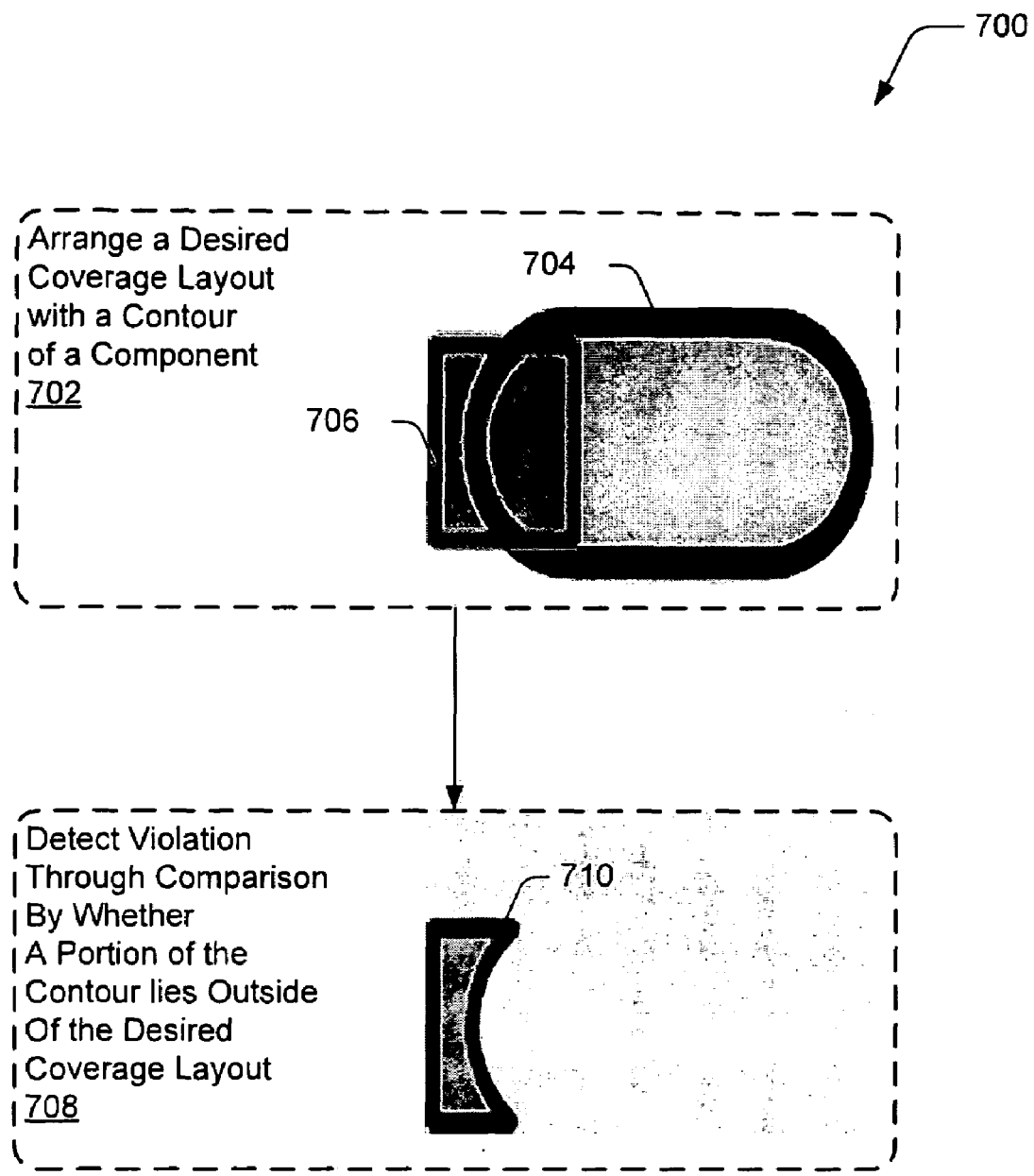
FIG. 7 is a flow diagram depicting a procedure in an exemplary implementation in which a coverage violation is detected by a geometric operation.

FIG. 7 depicts a procedure 700 in an exemplary implementation in which a coverage violation is detected by a geometric operation. An approximation of a desired coverage layout is arranged with a contour of a feature (block 702) produced from a mask. A feature 704, for instance, may have a desired coverage layout 706 defined as a minimal area of resist desired in a particular area of a mask to perform a function, such as to form a contact.

A violation is detected by determining whether a portion of the contour lies outside of the desired coverage layout (block 708). As illustrated in block 708, for instance, a portion 710 of the desired coverage layout is not covered, and therefore results in a violation in this example. A geometric representation of this portion 710 may be then output in a user interface as previously described. Thus, the coverage violation may be detected by a symmetric difference of a desired layout with an intersection of a contour taken from a mask and an approximation of a desired coverage layout.

Figure 8:
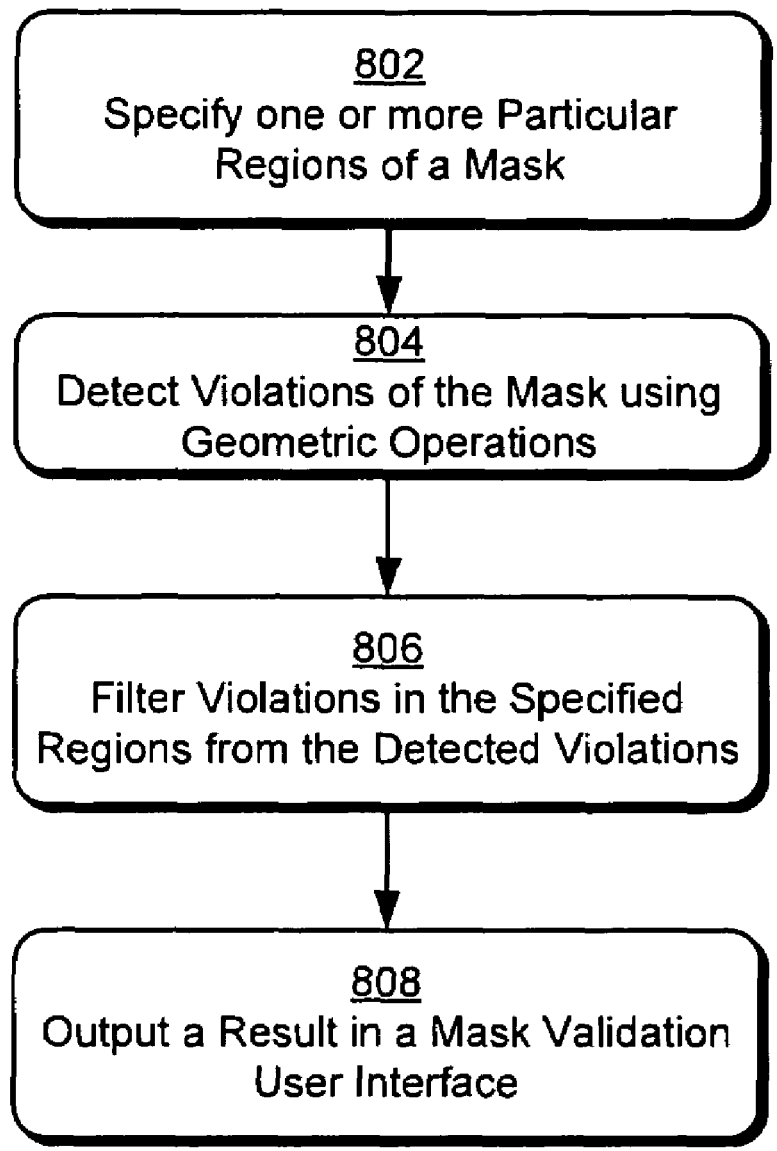
FIG. 8 is a flow diagram depicting a procedure in an exemplary implementation in which violations are filtered from specified regions of a mask.

FIG. 8 depicts a procedure 800 in an exemplary implementation in which violations are filtered from specified regions of a mask. One or more particular regions of a mask are specified (block 802). For example, a user may specify regions that have a relatively higher probability of deviation from features specified for other regions of the mask but which are permissible. Therefore, the user does not wish for these regions to "count" as deviations in the analysis of the mask.

Violations of the mask are detected using geometric operations (block 804), such as through use of the techniques previously described in relation to FIGS. 3-7. Violations in the specified regions are then filtered from the detected violations (block 806) and a result of which is output in a mask validation user interface (block 808). Thus, in this way the "permissible" violations do not interfere with "impermissible" violations. Although in this implementation violations were detected in the specified areas and then filtered from the result, a variety of other implementations are also contemplated, such as by forgoing violation detection in the specified regions altogether.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A computing device implemented method comprising:
producing simulated resist contours from a mask usable to manufacture a semiconductor device, wherein producing the simulated resist comprises:
sampling a photolithographic simulation of the mask to obtain a plurality of sampling points;
connecting sampling points to form the simulated resist contours;
modifying the simulated resist contour by shrinking the simulated resist contour by approximately one-half of a pinch tolerance;
growing the shrunk simulated resist contour by approximately one-half of the pinch tolerance; and
validating the mask by comparing the original simulated resist contour to the modified simulated resist contour to determine a symmetric difference, wherein if the symmetric difference indicate a violation of the desired wafer geometries, outputting a geometric representation of a portion of the mask that resulted in the violation to a user interface, validating further comprising determining whether the simulated contours include a pinch violation.

2. A computing device implemented method as described in claim 1, wherein the validating includes determining whether the simulated contours include a bridge violation.

3. A computing device implemented method as described in claim 1, wherein the validating includes determining whether the simulated contours include a positive deviation violation.

4. A computing device implemented method as described in claim 1, wherein the validating includes determining whether the simulated contours include a negative deviation violation.

5. A computing device implemented method as described in claim 1, wherein the validating includes determining whether the simulated contours include a coverage violation.

6. A computing device implemented method as described in claim 1, further comprising filtering violations from one or more particular regions of the simulated contours.

7. One or more computer readable media comprising computer-executable instructions that, when executed, direct a computing device to:
produce simulated resist contours from a mask usable to manufacture a semiconductor device, wherein producing the simulated resist comprises:
sampling a photolithographic simulation of the mask to obtain a plurality of sampling points;
connecting sampling points to form the simulated resist contours;
modifying the simulated resist contour by shrinking the simulated resist contour by approximately one-half of a pinch tolerance;
growing the shrunk simulated resist contour by approximately one-half of the pinch tolerance; and
validate the mask by comparing the original simulated resist contour to the modified simulated resist contour to determine a symmetric difference, wherein if the symmetric difference indicate a violation of the desired wafer geometries, output a geometric representation of a portion of the mask that resulted in the violation to a user interface, validating further comprising determining whether the simulated contours include a pinch violation.

8. One or more computer readable media as described in claim 7, wherein the user interface, when output, depicts the one or more violations as superimposed over the simulated contours.

9. One or more computer readable media as described in claim 7, wherein the user interface, when output, depicts the one or more violations as geometric shapes representing physical features that resulted in the one or more violations.

10. One or more computer readable media as described in claim 7, wherein the validation, when performed, detects pinch violations, bridge violations, positive deviation violations, negative deviation violations and coverage violations in the simulated contours.

11. An apparatus comprising:
a display device;
a processor; and
memory configured to maintain one or more modules that are executable on the processor, the one or more modules configured to be executed to perform a method comprising:
producing simulated resist contours from a mask usable to manufacture a semiconductor device, wherein producing the simulated resist comprises:
sampling a photolithographic simulation of the mask to obtain a plurality of sampling points; and
connecting sampling points to form the simulated resist contours;
modifying the simulated resist contour by shrinking the simulated resist contour by approximately one-half of a pinch tolerance;
growing the shrunk simulated resist contour by approximately one-half of the pinch tolerance; and
validating the mask by comparing the original simulated resist contour to a modified simulated resist contour to determine a symmetric difference, wherein if the symmetric difference indicate a violation of the desired wafer geometries, outputting a geometric representation of a portion of the mask that resulted in the violation to a user interface, validating further comprising determining whether the simulated contours include a pinch violation.

12. An apparatus as described in claim 11, wherein the one or more modules are executable to perform the validation, which when performed, detects pinch violations, bridge violations, positive deviation violations, negative deviation violations, and coverage violations in the simulated contours.

13. An apparatus as described in claim 11, wherein the one or more modules are executable to depict the one or more violations as superimposed over the simulated contours in the user interface.

14. An apparatus as described in claim 11, wherein the one or more modules are executable to filter violations from one or more particular regions of the simulated contours.

15. An apparatus as described in claim 14, wherein the one or more particular regions of the mask are specified by a user.

16. A computing device implemented method comprising:
producing simulated resist contours from a mask usable to manufacture a semiconductor device, wherein producing the simulated resist comprises:
sampling a photolithographic simulation of the mask to obtain a plurality of sampling points; and
connecting sampling points to form the simulated resist contours;
modifying the simulated resist contour by growing an original simulated resist contour by approximately one-half of a bridge tolerance;
shrinking the grown original simulated resist contour by approximately one-half of the bridge tolerance; and
validating the mask by comparing the original simulated resist contour to the modified simulated resist contour to determine a symmetric difference, wherein if the symmetric difference indicate a violation of the desired wafer geometries, outputting a geometric representation of a portion of the mask that resulted in the violation to a user interface, validating further comprising determining whether the simulated contours include a bridge violation.

17. One or more computer readable media comprising computer-executable instructions that, when executed, direct a computing device to:
produce simulated resist contours from a mask usable to manufacture a semiconductor device, wherein producing the simulated resist comprises:
sampling a photolithographic simulation of the mask to obtain a plurality of sampling points; and
connecting sampling points to form the simulated resist contours;
modifying the simulated resist contour by growing an original simulated resist contour by approximately one-half of a bridge tolerance;
shrinking the grown original simulated resist contour by approximately one-half of the bridge tolerance; and
validate the mask by comparing the original simulated resist contour to the modified simulated resist contour to determine a symmetric difference, wherein if the symmetric difference indicate a violation of the desired wafer geometries, output a geometric representation of a portion of the mask that resulted in the violation to a user interface, validating further comprising determining whether the simulated contours include a bridge violation.

18. An apparatus comprising:
a display device;
a processor; and
memory configured to maintain one or more modules that are executable on the processor, the one or more modules configured to be executed to perform a method comprising:
producing simulated resist contours from a mask usable to manufacture a semiconductor device, wherein producing the simulated resist comprises:
sampling a photolithographic simulation of the mask to obtain a plurality of sampling points; and
connecting sampling points to form the simulated resist contours;
modifying the simulated resist contour by growing an original simulated resist contour by approximately one-half of a bridge tolerance;
shrinking the grown original simulated resist contour by approximately one-half of the bridge tolerance; and
validating the mask by comparing the original simulated resist contour to the modified simulated resist contour to determine a symmetric difference, wherein if the symmetric difference indicate a violation of the desired wafer geometries, outputting a geometric representation of a portion of the mask that resulted in the violation to a user interface, validating further comprising determining whether the simulated contours include a bridge violation.

* * * * *